US007008878B2

(12) United States Patent
Hsu et al.

(10) Patent No.: US 7,008,878 B2
(45) Date of Patent: Mar. 7, 2006

(54) PLASMA TREATMENT AND ETCHING PROCESS FOR ULTRA-THIN DIELECTRIC FILMS

(75) Inventors: Ju-Wang Hsu, Taipei (TW); Yuan-Hung Chiu, Taipei (TW); Hun-Jan Tao, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/738,237

(22) Filed: Dec. 17, 2003

(65) Prior Publication Data

US 2005/0136680 A1 Jun. 23, 2005

(51) Int. Cl.
*H01L 21/302* (2006.01)
*H01L 21/461* (2006.01)

(52) U.S. Cl. .................. 438/738; 438/711; 438/714; 438/733; 438/771; 438/788

(58) Field of Classification Search ............... 438/700, 438/706, 591, 287, 763, 791, 792, 707, 710, 438/711, 741, 733, 737, 738, 769–772, 786–788
See application file for complete search history.

(56) References Cited

U.S. PATENT DOCUMENTS

| 5,116,460 A | * | 5/1992 | Bukhman | 438/696 |
| 6,380,056 B1 | * | 4/2002 | Shue et al. | 438/591 |
| 6,479,402 B1 | * | 11/2002 | Yang et al. | 438/763 |

* cited by examiner

*Primary Examiner*—Michael Trinh
*Assistant Examiner*—Khanh Duong
(74) *Attorney, Agent, or Firm*—Tung & Associates

(57) ABSTRACT

A method for dry etching a dielectric layer including providing a substrate; forming at least one overlying dielectric layer over the substrate; subjecting the at least one overlying layer to a plasma oxidizing process; and, subjecting the at least one overlying layer to a plasma etching process.

17 Claims, 3 Drawing Sheets

FLOW RATE RATIO $O_2/C_XH_YF_Z$

FLOW RATE RATIO $O_2/C_XH_YF_Z$

PLASMA TREATMENT AND ETCHING PROCESS FOR ULTRA-THIN DIELECTRIC FILMS

FIELD OF THE INVENTION

This invention generally relates to processes for forming semiconductor devices including CMOS and MOSFET devices and more particularly to a plasma treatment and etching method to improve selectivity in etching ultra-thin films.

BACKGROUND OF THE INVENTION

As MOSFET and CMOS device characteristic sizes are scaled down to below 0.25 microns including below 0.1 microns, the process window for dry etching processes is increasingly difficult to control. For example, a fine balance between an etching rate and an etching selectivity to underlying materials is increasingly difficult to control given the limited range within which a particular etching process may be varied in etching ultra-thin dielectric films.

Increasingly with smaller device sizes, it is necessary to etch through a thickness of a thin film of material, for example less than about 100 Angstroms without causing etching damage to an underlying material layer. Perhaps most critical, are etching processes to remove material layers overlying semiconductor substrate portions such as the source and drain regions as well as removing material overlying or adjacent to polysilicon gate electrodes.

Several approaches to improve dry etching processes have included using polymer forming fluorocarbon, fluorohydrocarbon, and perfluorocarbon containing etching chemistries. The general concept is that, depending on the etching chemistry, a polymer layer is formed from the etching chemistry constituents to create a covering over portions of the etching surface thereby controlling an etching rate and anisotropicity. A problem with this approach has been the high RF powers required to sufficiently dissociate the etching chemistry constituent to form the polymer layer which additionally increases the etching rate thereby making the controlled etching of thin layers more difficult to control. On the other hand, reducing RF power to reduce the etching rate causes poor selectivity and deteriorates etching uniformity.

One particular problematic area where the etching of thin layers has created a problem is in the formation of sidewall spacer dielectrics, also referred to as offset spacer dielectrics, formed adjacent to the gate structure. The sidewall spacer dielectric formed adjacent either side of the gate structure serves to allow source/drain extensions (SDE) to be formed whereby a relatively lower amount of N or P-type doping is first formed in the semiconductor substrate adjacent the gate structure by ion implantation prior to forming the sidewall spacers which then act as an ion implant mask for forming higher doped regions adjacent the sidewall spacers.

As device characteristic dimensions shrink below about 0.25 microns including below about 0.1 micron, achieving close dimensional tolerances of sidewall spacers is critical to achieving reliable electric performance and avoiding short channel effects (SCE). For example, SDE regions affect SCE according to both depth and width of the SDE doped region. The formation of sidewall spacers typically requires dry etching processes to remove portions of the sidewall spacer dielectric layer overlying a different material such as an oxide or silicon where overetching can degrade device performance or require additional processing steps to repair the damage.

There is therefore a continuing need in the semiconductor integrated circuit manufacturing art for improved dry etching processes for thin film dielectrics whereby a process control window is improved including achieving a higher etching selectivity to underlying layers as well as avoiding unintentional overetching of thin dielectric layers.

It is therefore among the objects of the present invention to provide improved dry etching processes for thin film dielectrics whereby a process control window is improved including achieving a higher etching selectivity to underlying layers as well as avoiding unintentional etching and damage to underlying layers, in addition to overcoming other shortcomings of the prior art.

SUMMARY OF THE INVENTION

To achieve the foregoing and other objects, and in accordance with the purposes of the present invention, as embodied and broadly described herein, the present invention provides a method for dry etching a dielectric layer.

In a first embodiment, the method includes providing a substrate; forming at least one overlying dielectric layer over the substrate; subjecting the at least one overlying layer to a plasma oxidizing process; and, subjecting the at least one overlying layer to a plasma etching process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained by reference to exemplary manufacturing processes where the method of the present invention may be advantageously used, it will be appreciated that the method of the present invention may be used in any dry etching process whereby improved control over the dry etching process including removal of thin layers of material and increasing a selectivity in etching with respect to an underlying material layer is achieved.

Figure 1A:
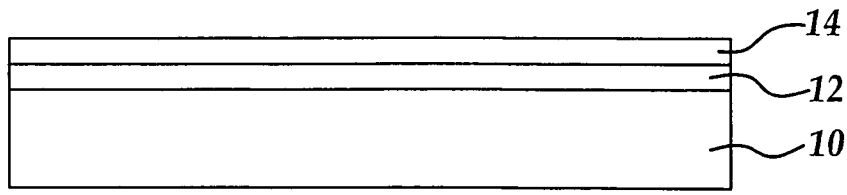
FIGS. 1A–1E are cross sectional views of a portion of a semiconductor device showing exemplary stages in a dry etching process according to an embodiment of the invention.

In an exemplary embodiment of the present invention, reference is made to FIGS. 1A–1E where cross sectional schematic views are shown of an exemplary thin film stack overlying a substrate. Referring to FIG. 1A, the substrate 10 may be any metal, semiconductor or oxide substrate. Preferably, the substrate 10 is a material oxidizable by an oxidizing plasma process, for example a silicon substrate. In one embodiment, a silicon oxide layer 12 is formed over the silicon substrate, for example thermally grown or deposited by an LPCVD or PECVD process using e.g., tetra-ethyl-ortho-silicate (TEOS) and ozone ($O_3$), or silane and oxygen ($O_2$) by methods known in the art. Preferably, the oxide layer 12 is a thin layer having a thickness from about 20 Angstroms to about 150 Angstroms, more preferably an ultra-thin layer defined herein as having a thickness less than about 100 Angstroms.

Still referring to FIG. 1A, an overlying dielectric layer 14 is deposited, preferably a material oxidizable by an oxidizing plasma process, for example a nitride containing layer such as silicon nitride (e.g., SIN, $Si_3N_4$) or nitrogen rich (e.g., Y>X) silicon oxynitride (e.g., SiON, $SiO_xN_y$). Preferably, the dielectric layer 14 has a thickness less than about 150 Angstroms, more preferably an ultra-thin layer of less than about 100 Angstroms.

Figure 1B:
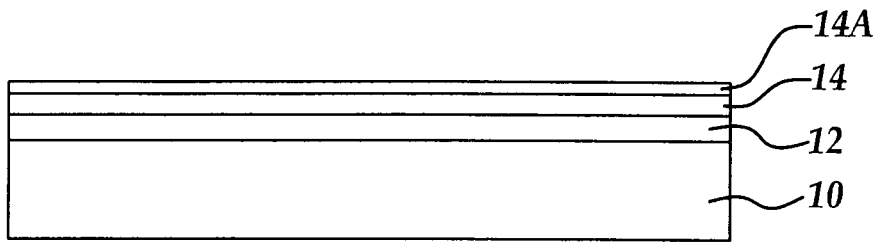

Referring to FIG. 1B, in one embodiment of carrying out the method of the present invention, an oxidizing plasma treatment is first carried out to oxidize an upper most portion of dielectric layer 14, e.g., 14A. The oxidized portion 14A, for example is formed at a thickness of from about 20 Angstroms to about 80 Angstroms depending on the density of the dielectric layer 14 and the time period of carrying out the oxidizing plasma treatment.

Figure 1C:
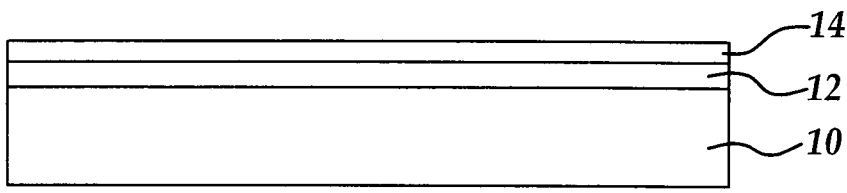
Figure 1D:
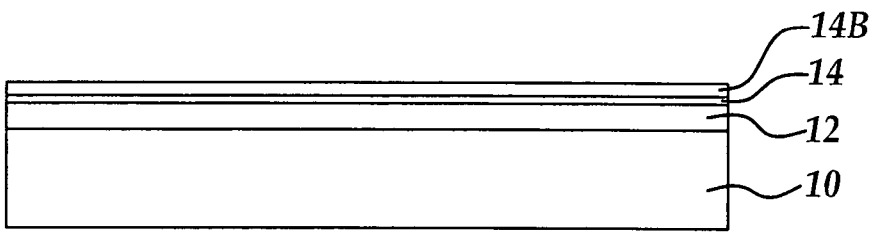
Figure 1E:
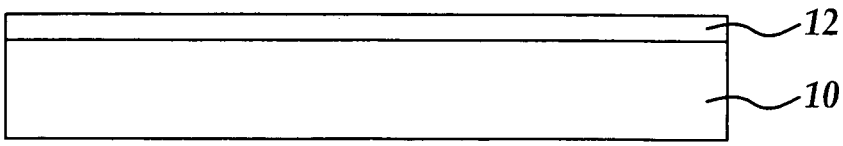

Referring to FIG. 1C, following the oxidizing plasma treatment to form oxidized portion 14A, a dry etching process is then carried out, preferably to remove at the least the oxidized portion 14A of dielectric layer 14. The oxidizing plasma treatment followed by etching is optionally repeated as necessary to complete removal of the overlying ultra-thin dielectric layer 14. For example, referring to FIG. 1D, a subsequent oxidizing plasma treatment to form oxidized portion 14B of dielectric layer 14 is carried out followed by etching the oxidized portion of dielectric layer to reveal the underlying layer e.g., oxide layer 12 as shown in FIG. 1E.

The oxidizing plasma treatment may be carried out in-situ or ex-situ with respect to the etching process, for example the oxidizing treatment is carried out in the same plasma reactor or separate plasma reactors as the etching process. For example, the oxidizing plasma treatment can be carried out in a plasma reactor dedicated to ashing (oxidizing) processes and the etching process carried out in a separate plasma etcher dedicated to etching processes.

The plasma reactor for oxidizing and/or etching may accomplished with a variety of RF power sources and reactor configurations known in the art including inductively coupled plasma (ICP), decoupled plasma source (DPS), magnetically enhanced reactive ion etching (MERIE), electron cyclotron resonance (ECR), downstream plasma, parallel plate and the like.

The oxidizing plasma treatment preferably includes one or more plasma source gases including oxygen containing gases such as $O_2$, CO, $CO_2$, NO, $NO_2$, and $O_3$. The plasma source gases may additionally include nitrogen ($N_2$) and ($H_2$). Following the oxidizing plasma process for a period of time, for example from about 3 seconds to about 60 seconds, an etching process to remove at least the oxidized portion e.g., 14A or 14B of dielectric layer 14 is then carried out using an etching chemistry including one or more oxygen containing gases, as previously listed, preferably $O_2$, in addition to one or more fluorohydrocarbons (e.g., $C_xH_yF_z$), such as $CH_2F_2$, $CHF_3$, $C_2H_2F_4$, $C_3H_2F_6$, $C_4H_2F_8$, and $C_5H_4F_8$, or mixtures thereof.

In another embodiment, the oxidizing plasma treatment is modulated in-situ by sequentially carrying out a primarily oxidizing process followed by a primarily etching plasma process. For example, a relative flow rate ratio of the fluorohydrocarbon plasma source gases flow rate to the oxygen containing plasma source gas flow rate is reduced (including being stopped) by reducing the fluorohydrocarbon plasma source gases flow rate and/or increasing the oxygen containing plasma source gas flow rate to preferentially oxidize an uppermost portion e.g., 14A or 14B of dielectric layer 14 for a period of time. The relative flow rate ratio of the fluorohydrocarbon plasma source gases flow rate to the oxygen containing plasma source gas flow rate is then increased to perform preferential etching of the oxidized portion of the dielectric layer.

In another embodiment, the fluorohydrocarbon plasma source gases and the oxygen containing plasma source gases are supplied simultaneously during the etching process at a selected steady state flow rate ratio of oxygen containing plasma source gases to fluorohydrocarbon plasma source gases to achieve a steady state rate of oxidation and etching of the dielectric layer 14.

Figure 2A:
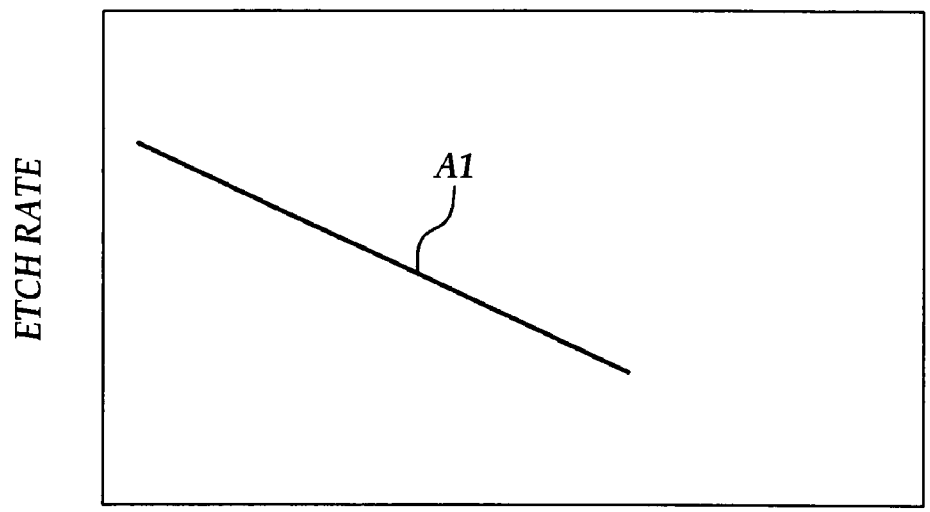
FIGS. 2A and 2B are conceptual representation of an etch rate and a selectivity according to embodiments of the present invention.

For example, referring to FIG. 2A is shown a conceptual relationship between the etch rate of SiN, shown on the vertical axis and a relative flow rate ratio of oxygen containing source gas flow rate, e.g., $O_2$ to a fluorohydrocarbon plasma source gas flow rate, hereinafter referred to as an O/F flow rate ratio, shown on the horizontal axis. The etching relationship to the O/F flow rate is represented by line A1. It is seen that by increasing the O/F flow rate ratio, that the etch rate of SiN is reduced, and primarily oxidation of the uppermost dielectric layer portion takes place. It will be appreciated that the desired O/F ratio will depend in part on the fluorohydrocarbon, for example a fluorine to carbon ratio (e.g., less than about 4), and the type of oxygen containing gas used. For example the relative flow rates of oxygen containing plasma source gases to fluorohydrocarbon plasma source gases may vary between about 10:1 to about 1:10 for a respective oxidizing and etching plasma treatment.

In exemplary operation, it is preferable when etching a silicon nitride (e.g., SiN) uppermost dielectric layer overlying an oxide layer, e.g., a TEOS oxide layer, that the O/F flow rate ratio is adjusted such that the selectivity i.e., the etch rate of SiN to oxide etch rate, is greater than about 20 to 1. For example the O/F ratio is increased by either increasing the oxygen flow rate and/or decreasing the fluorohydrocarbon flow rate to achieve an etch rate of silicon nitride of about 10 to about 40 Angstroms per minute and an etch rate of oxide of about 0.5 to about 1.5 Angstroms/minute with a selectivity of between about 10 and about 80, more preferably, a selectivity greater than about 20.

Figure 2B:
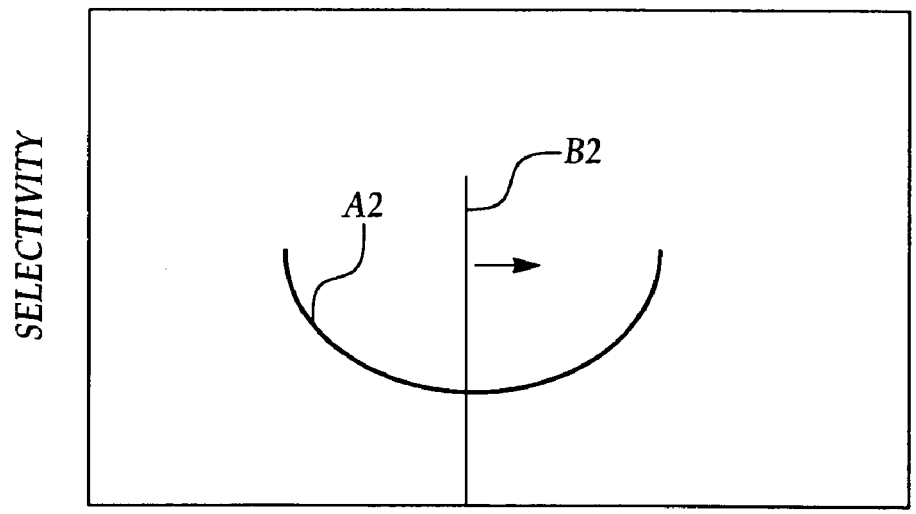

Referring to FIG. 2B, is shown a conceptual diagram of SiN/oxide etch selectivity which corresponds to an etch rate ratio of silicon nitride (e.g., uppermost layer e.g., 14) to oxide (e.g., underlying layer e.g., 12) on the vertical axis. On the horizontal axis is shown an arbitrary increasing O/F flow rate ratio. The preferable area of operation in either sequential, in-situ modulated, or steady state modes of operation of oxidizing/etching treatments according to preferred embodiments of the present invention, is adjusting the selectivity represented by line A2 to the right of line B2 (increasing O/F ratio), where the selectivity of the uppermost dielectric layer, e.g., SiN or SiON, is increasing with respect to an underlying layer e.g., oxide or silicon, as the O/F flow rate ratio is increased.

It will be appreciated that the method of the present invention is equally applicable where an underlying layer is silicon or an oxidizable metal since the oxidizing effect of the oxygen containing plasma source gas forms a thin oxide layer in an uppermost portion of the silicon (e.g., 20 to 80 Angstroms in thickness in sequential oxidizing/etching treatment). Preferably, in exemplary steady state operation, the O/F flow rate is adjusted so that the selectivity of SiN to the underlying layer (e.g., oxide or silicon) is greater than about 10, more preferably greater than about 20.

Figure 3A:
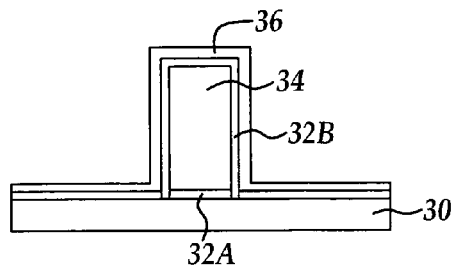
FIGS. 3A–3B are cross sectional views of a portion of a gate structure portion of a MOSFET showing exemplary manufacturing stages in an integrated circuit manufacturing process according to an embodiment of the present invention.

Referring to FIG. 3A is shown an exemplary implementation of the method of the present invention. Shown is a silicon substrate 30, having overlying oxide layers e.g., gate oxide portion 32A, and sidewall oxide portion 32B. Gate oxide portion 32A and overlying polysilicon gate electrode portion 34 are formed by conventional processes followed by blanket deposition of an ultra-thin (less than about 100 Angstroms) oxide sidewall layer 32B, e.g., by a CVD process, for example an LPCVD process using e.g., TEOS and $O_3$. An ultra-thin (less than about 100 Angstroms) silicon nitride layer 36 is then blanket deposited over the oxide layer 42B, e.g., by an LPCVD process.

Figure 3B:
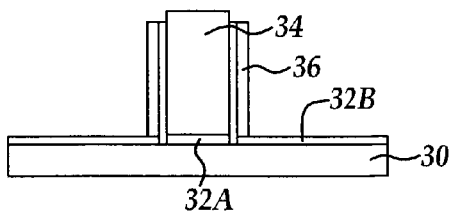

Referring to FIG. 3B, the oxidizing plasma treatments and etching treatments are carried out according to preferred embodiments, e.g., one of an in-situ or ex-situ sequential oxidizing/etching treatments, in-situ modulated oxidizing/etching treatments, and a steady state oxidizing/etching treatment. Advantageously, the silicon nitride layer 36 is selectively removed over the horizontal surface portion of underlying oxide layer 32B while avoiding overetching the oxide layer 32B in addition to maintaining a desired width dimension of the silicon nitride layer 36 sidewall portion, preferably less than about 100 Angstroms, including less than about 50 Angstroms.

Figure 4A:
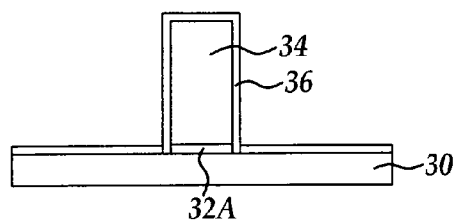
FIGS. 4A–4B are cross sectional views of a portion of a gate structure portion of a MOSFET showing exemplary manufacturing stages in an integrated circuit manufacturing process according to an embodiment of the present invention.

Referring to FIG. 4A is shown a similar gate structure as shown in FIG. 4A with similar reference numerals referring to similar structures. In FIG. 4A, the sidewall oxide layer portion 32B is not formed, rather, an ultra-thin (less than about 100 Angstroms) silicon nitride layer 36 is blanket deposited overlying and contacting the polysilicon gate electrode 34 and over the silicon substrate 30.

Figure 4B:
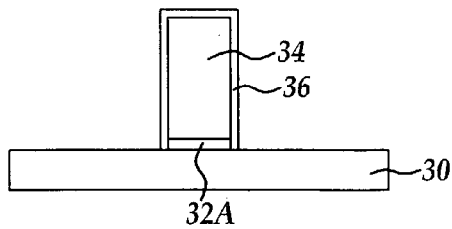

Referring to FIG. 4B, the oxidizing plasma treatments and etching treatments are carried out according to preferred embodiments e.g., one of an in-situ or ex-situ sequential oxidizing/etching treatments, in-situ modulated oxidizing/etching treatments, and a steady state oxidizing/etching treatment. Advantageously, the silicon nitride layer 36 can be selectively removed over the surface portion of the silicon substrate 30, while avoiding damage to the exposed silicon substrate 30 surface portion and while maintaining a desired width dimension of the silicon nitride layer sidewall portion.

Figure 5:
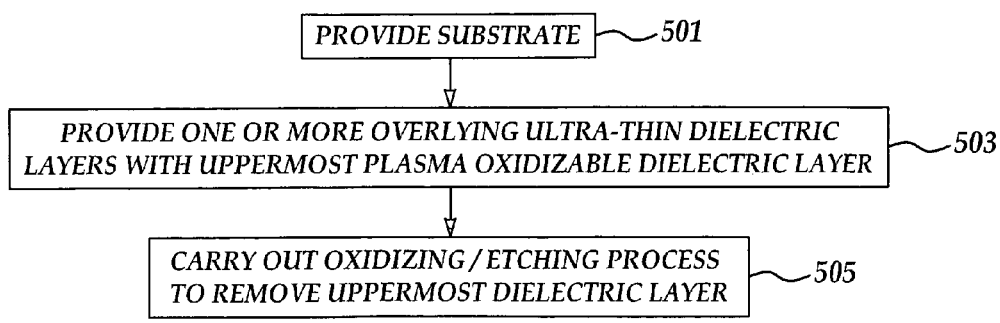
FIG. 5 is a process flow diagram including several embodiments of the present invention.

Referring to FIG. 5 is a process flow diagram including several embodiments of the present invention. In process 501, a silicon substrate is provided. In process 503, one or more overlying ultra-thin dielectric layers are formed with an uppermost plasma oxidizable dielectric layer. In process 505, an oxidizing/etching process is carried out according to preferred embodiments to remove at least the uppermost plasma oxidizable dielectric layer.

Thus a method has been presented for dry etching ultra-thin dielectric layers to increase a process control window by achieving a slower overlying dielectric layer etch rate while increasing a selectivity with respect to an underlying material layer, by either first oxidizing a surface portion followed by etching or achieving a steady state oxidizing and etching effect with respect to the overlying dielectric layer.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for dry etching a dielectric layer comprising the steps of:
    providing a substrate;
    forming at least one overlying dielectric layer over the substrate;
    subjecting the at least one overlying dielectric layer to a plasma oxidizing process to form an oxidized dielectric portion; and,
    subjecting the oxidized dielectric portion to a plasma etching process, wherein the plasma etching process comprises a ratio of an oxygen containing plasma source gas to a fluorohydrocarbon plasma source gas wherein an increasing flow rate of the oxygen containing plasma gas source increases an etching selectivity with respect to an underlying material layer.

2. A method for etching a sidewall spacer comprising the steps of:
    providing a semiconductor substrate comprising a gate structure;
    forming a dielectric layer covering the gate structure;
    plasma oxidizing the dielectric layer to form an oxidized dielectric portion; and,
    plasma etching the oxidized dielectric portion to selectively remove the oxidized dielectric portion over horizontal surfaces.

3. The method of claim 2, wherein the semiconductor substrate comprises a material oxidizable by the plasma oxidizing process to form an oxidized substrate portion.

4. The method of claim 2, wherein the semiconductor substrate comprises a material selected from the group consisting of silicon and silicon oxide.

5. The method of claim 2, wherein the dielectric layer comprises a material selected from the group consisting of silicon nitride and silicon oxynitride.

6. The method of claim 2, wherein the plasma oxidizing process and the plasma etching process are performed sequentially ex-situ.

7. The method of claim 2, wherein the plasma oxidizing process and the plasma etching process are performed sequentially in-situ.

8. The method of claim 2, wherein the plasma oxidizing process and the plasma etching process are performed about simultaneously in steady state.

9. The method of claim 2, wherein the plasma oxidizing process comprises an oxygen containing plasma gas source.

10. The method of claim 2, wherein the plasma oxidizing process comprises a plasma gas source selected from the group consisting of $O_2$, CO, $CO_2$, NO, $NO_2$, and $O_3$.

11. The method of claim 2, wherein the plasma etching process comprises a fluorohydrocarbon plasma source gas.

12. The method of claim 2, wherein the plasma etching process comprises a ratio of an oxygen containing plasma source gas to a fluorohydrocarbon plasma source gas wherein the selectivity with respect to an underlying material layer is greater than about 20.

13. The method of claim 2, wherein an uppermost dielectric layer of the dielectric layer is less than about 100 Angstroms in thickness.

14. The method of claim 2, wherein the semiconductor substrate comprises a gate structure.

15. The method of claim 2, wherein the at least dielectric layer comprises a sidewall spacer dielectric layer selected from the group consisting of silicon nitride, silicon oxynitride, and silicon oxide.

16. The method of claim 2, wherein the steps of plasma oxidizing and etching are repeated.

17. The method of claim 16, wherein an ultra-thin dielectric portion remains covering the sidewall portions of the gate structure.

* * * * *